(12) United States Patent
Tian et al.

(10) Patent No.: US 12,267,074 B2
(45) Date of Patent: Apr. 1, 2025

(54) DYNAMIC D FLIP-FLOP WITH AN INVERTED OUTPUT

(71) Applicant: SHENZHEN MICROBT ELECTRONICS TECHNOLOGY CO., LTD., Guangdong (CN)

(72) Inventors: Wenbo Tian, Guangdong (CN); Zhijun Fan, Guangdong (CN); Haifeng Guo, Guangdong (CN); Zuoxing Yang, Guangdong (CN)

(73) Assignee: SHENZHEN MICROBT ELECTRONICS TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 18/002,302

(22) PCT Filed: Apr. 16, 2021

(86) PCT No.: PCT/CN2021/087622
§ 371 (c)(1),
(2) Date: Dec. 19, 2022

(87) PCT Pub. No.: WO2021/258824
PCT Pub. Date: Dec. 30, 2021

(65) Prior Publication Data
US 2023/0238947 A1    Jul. 27, 2023

(30) Foreign Application Priority Data
Jun. 22, 2020   (CN) .......................... 202010575350.6

(51) Int. Cl.
*H03K 3/3562*   (2006.01)
*H03K 3/012*    (2006.01)
*H03K 3/356*    (2006.01)

(52) U.S. Cl.
CPC ......... *H03K 3/35625* (2013.01); *H03K 3/012* (2013.01); *H03K 3/356008* (2013.01)

(58) Field of Classification Search
CPC ............... H03K 3/35625; H03K 3/012; H03K 3/356008; H03K 3/3562
See application file for complete search history.

(56) References Cited

U.S. PATENT DOCUMENTS 10,467,365 B1 * 11/2019 Kulshreshtha ...... G06F 30/3312
2006/0197571 A1    9/2006 Kim
(Continued)

FOREIGN PATENT DOCUMENTS

CA    3098955 A1    1/2020
CN    110311655    *  8/2019
(Continued)

OTHER PUBLICATIONS

International Search Report and Written Opinion mailed Jul. 15, 2021 in International Application No. PCT/CN2021/087622.
(Continued)

*Primary Examiner* — Sibin Chen
(74) *Attorney, Agent, or Firm* — Dickinson Wright PLLC

(57) ABSTRACT

A dynamic D flip-flop with an inverted output involves an input end (101) used for receiving input data; an output end (102) used for providing output data to respond to the input data; a clock signal end (103) used for receiving a clock signal; a first latch (104) used for latching the input data from the input end (101) and performing inverting transmission on the input data under the control of the clock signal; a second latch (105) used for latching data from the first latch (104) and performing inverting transmission on the data latched by the first latch (104) under the control of the clock signal; and an inverter (106) used for performing inverting output on the data received from the second latch
(Continued)

(105), the first latch (104), the second latch (105), and the inverter (106) being sequentially connected in series between the input end and the output end.

11 Claims, 7 Drawing Sheets

(56) References Cited

U.S. PATENT DOCUMENTS

| | | | | |
|---|---|---|---|---|
| 2016/0056801 | A1* | 2/2016 | Cai | H03K 3/35625 |
| | | | | 327/203 |
| 2018/0006808 | A1* | 1/2018 | Suresh | H04L 9/0643 |
| 2020/0106424 | A1* | 4/2020 | Venugopal | H03K 19/096 |
| 2021/0058073 | A1* | 2/2021 | Wu | H03K 3/0372 |

FOREIGN PATENT DOCUMENTS

| | | |
|---|---|---|
| CN | 110311655 A | 10/2019 |
| CN | 110633104 A | 12/2019 |
| CN | 110635783 A | 12/2019 |
| CN | 110635784 A | 12/2019 |
| CN | 110635785 A | 12/2019 |
| CN | 110635786 A | 12/2019 |
| CN | 111600577 A | 8/2020 |
| CN | 212726968 U | 3/2021 |

OTHER PUBLICATIONS

First Office Action issued in Taiwanese Patent Application No. 110113677.
Second Office Action issued in Taiwanese Patent Application No. 110113677.
Final Rejection issued in Taiwanese Patent Application No. 110113677.
First Office Action issued in TW Application No. 110113677.
Second Office Action issued in TW Application No. 110113677.
Final Rejection issued in TW Application No. 110113677.
Notice of Allowance issued in TW Application No. 110113677.

* cited by examiner

DYNAMIC D FLIP-FLOP WITH AN INVERTED OUTPUT

CROSS-REFERENCE TO RELATED APPLICATIONS

The present application is a U.S. National Phase of International Patent Application PCT/CN2021/087622, filed on Apr. 16, 2021, which claims the priority of Chinese Patent Application No. 202010575350.6, filed on Jun. 22, 2020, both of which are hereby incorporated by reference in their entireties.

TECHNICAL FIELD

Generally, the present disclosure relates to a dynamic D flip-flop with an inverted output.

BACKGROUND

As a peer-to-peer (P2P) virtual cryptocurrency, Bitcoin was first conceptually proposed by Satoshi Nakamoto on Nov. 1, 2008 and officially born on Jan. 3, 2009. Distinctively, Bitcoin is derived from numerous computations in accordance with the specific algorithm, instead of being issued by a specific currency institution. The Bitcoin transactions use a distributed database consisting of a variety of nodes throughout the entire P2P network, to validate and record all the transactions, and are cryptographically designed to ensure safety.

SUMMARY

According to one aspect of the present disclosure, the present disclosure provides a dynamic D flip-flop with an inverted output, including an input end for receiving input data; an output end for providing output data in response to the input data; a clock signal end for receiving clock signals; a first latch for latching the input data from the input end and carrying out, under the control of the clock signals, inverted transmission on the input data; a second latch for latching the data from the first latch and carrying out, under the control of the clock signals, inverted transmission on the data latched by the first latch; and an inverter for carrying out inverted output on the data received from the second latch, the first latch, the second latch, and the inverter being sequentially connected in series between the input end and the output end.

In another aspect, the present disclosure provides a multi-channel parallel register, including a plurality of input ends for inputting data; a plurality of output end for outputting data; a clock signal end for receiving clock signals; and a clock buffer for buffering the clock signals received by the clock signal end and then supplying the clock signals to a plurality of dynamic D flip-flops, the plurality of dynamic D flip-flops being connected in parallel between the plurality of input ends and the plurality of output ends for latching and/or reading, under the control of the clock signals, data, and the dynamic D flip-flops being the dynamic D flip-flops with an inverted output as described above.

In still another aspect, the present disclosure provides a device for executing a Bitcoin mining algorithm. The device includes the dynamic D flip-flop with an inverted output as described above or the multi-channel parallel register as described above.

Other features of the present disclosure and advantages thereof will become apparent from the following detailed description of exemplary embodiments of the present disclosure with reference to the drawings.

BRIEF DESCRIPTION OF DRAWINGS

The drawings, which constitute a part of this specification, describe the embodiments of the present disclosure and interpret the principles of the present disclosure together with this specification.

A clearer understanding of the present disclosure may be provided with reference to the drawings and the following detailed description.

Figure 1:
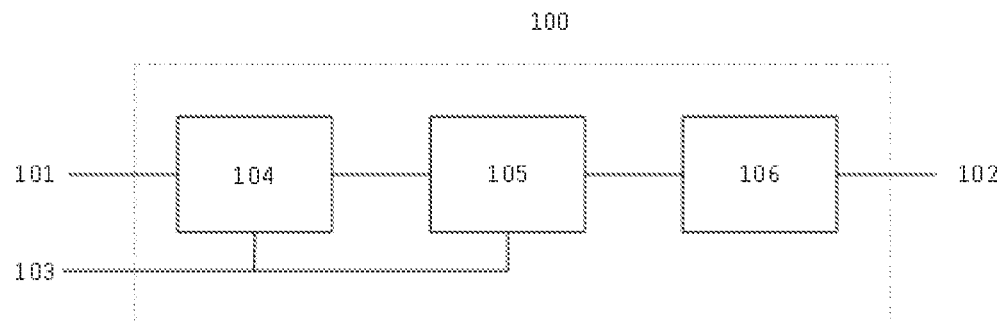
FIG. 1 shows a dynamic D flip-flop with an inverted output according to some embodiments of the present disclosure.

It should be noted that in the implementation described below, in some cases, the same reference numerals jointly used among different drawings denote the same portions or portions having the same functions, which is not described again. In the present description, similar reference numerals and letters are used to denote similar items. Therefore, once a certain item is defined in one accompanying drawing, it is not required to be further discussed in the subsequent drawings.

For ease of understanding, in some cases, positions, size, ranges, etc. of all structures shown in the drawings, etc. may not denote actual positions, sizes, ranges, etc. Therefore, the present disclosure is not limited to the positions, sizes, ranges, etc. disclosed in the drawings, etc. In addition, the drawings are not necessarily to be drawn in proportion, and some features may be exaggerated to show details of specific assemblies.

DETAILED DESCRIPTION OF THE EMBODIMENTS

Various exemplary embodiments of the present disclosure will now be described in detail with reference to the drawings. It should be noted that unless specifically stated otherwise, relative arrangements of components and steps, numerical expressions, and numerical values set forth in these embodiments do not limit the scope of the present disclosure.

The following description of at least one exemplary embodiment is merely illustrative in nature and definitely has no limitation on the present disclosure, and applications or use thereof. That is to say, circuits and methods for implementing a hash algorithm herein are exemplarily shown, to describe different embodiments of the circuits or methods in the present disclosure, instead of being intended for limiting, and merely illustrative examples for implementing the present disclosure in a non-exhaustive manner, which will be understood by those skilled in the art.

Techniques, methods, and apparatuses that are known to those of ordinary skill in the relevant art may not be discussed in detail, but, where appropriate, should be deemed as a constituent of the authorized description.

As a peer-to-peer (P2P) virtual cryptocurrency, Bitcoin was first conceptually proposed by Satoshi Nakamoto on Nov. 1, 2008 and officially born on Jan. 3, 2009. Distinctively, Bitcoin is derived from numerous computations in accordance with the specific algorithm, instead of being issued by a specific currency institution. The Bitcoin transactions use a distributed database consisting of a variety of nodes throughout the entire P2P network, to validate and record all the transactions, and are cryptographically designed to ensure safety.

Bitcoin mineworker used to mine with the central processing unit (CPU) products. The computationally-intensive mining, the increasingly more mineworkers, and the continuously-improved apparatus performance gradually increase the difficulty. Currently, mining with CPU results in almost no profit or even negative profit. Nowadays, the majority of mineworkers begin to use mining apparatuses such as an application-specific integrated circuit (ASIC) or a field-programmable gate array (FPGA).

The core of mining Bitcoin with the digital processing equipment such as the digital currency mining machine lies in the reward obtained from the computation capacity to compute SHA-256 of the mining machine. For the mining machine, the chip size, the chip running speed, and the chip power consumption are three significant factors that determine the properties of the mining machine, among which the chip size determines the chip cost, the chip running speed determines the running speed of the mining machine, that is, the hash rate, and the chip power consumption determines the extent of power consumption, that is, the mining cost. In the practical application, the power consumed per unit hash rate, that is, the power consumption and hash rate ratio is the most significant performance index of the mining machine.

For the mining, the mining process is to carry out numerous repetitive logic computations, which requires a large number of D flip-flops. The improper D flip-flops will expand the chip area, slow down the computation speed, and increase the power consumption, thereby lowering the power consumption and hash rate ratio of the mining machine at the end.

The D flip-flops can be applied in a wide range such as the digital signal register, the shift register, the frequency divider, the waveform generator, etc. The D flip-flop has two inputs of data (D) and clock (CLK), as well as one output (Q), and the data can be written into or read from the D flip-flop.

Accordingly, a computation apparatus for mining virtual currency is required to carry out numerous repetitive logic computations in a mining process, which requires a large number of D flip-flops for data storage. Therefore, the performance of the D flip-flop directly affects the performance of a computing chip, including a chip area, power consumption, computation speed, etc.

Compared with a static D flip-flop, the circuit structure of the dynamic D flip-flop may be greatly simplified due to the omitting of a positive feedback circuit used for maintaining a working state, thereby reducing both the chip area and the power consumption. In a logic design of the computing chip, in some cases, a D flip-flop with an inverted output will be required. For this case, the present disclosure provides a dynamic D flip-flop with an inverted output. Because of the reduction of one inverter, the dynamic D flip-flop with an inverted output provided by the present disclosure may effectively reduce a chip area and power consumption, which is greatly significant for a virtual currency computation apparatus using a large number of dynamic D flip-flops.

Therefore, to solve the problems described above, the present disclosure provides a dynamic D flip-flop with an inverted output for a computation apparatus and a parallel register composed of a multi-channel parallel dynamic D flip-flop with an inverted output, thereby effectively reducing an area and power consumption.

FIG. 1 shows a dynamic D flip-flop with an inverted output according to some embodiments of the present disclosure. The dynamic D flip-flop 100 with an inverted output includes an input end 101 for receiving input data; an output end 102 for providing output data in response to the input data; a clock signal end 103 for receiving clock signals; a first latch 104 for latching the input data from the input end 101 and carrying out, under the control of the clock signals, an inverted transmission on the input data; a second latch 105 for latching the data from the first latch 104 and carrying out, under the control of the clock signals, an inverted transmission on the data latched by the first latch 104; and an inverter 106 for carrying out an inverted output on the data received from the second latch 105, wherein the first latch 104, the second latch 105, and the inverter 106 being sequentially connected in series between the input end 101 and the output end 102, and the data of the output end 102 being inverted with respect to the data of the input end 101.

Figure 2:
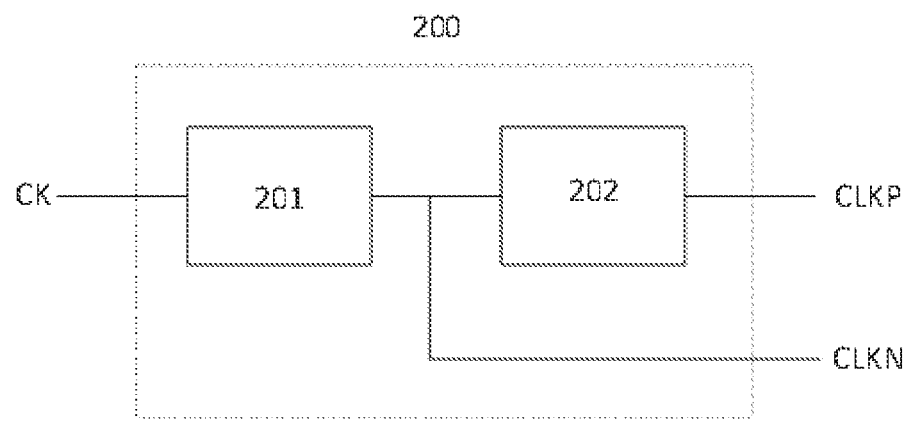
FIG. 2 shows a clock buffer for a dynamic D flip-flop with an inverted output according to some embodiments of the present disclosure.

FIG. 2 shows a clock buffer for providing clock signals of a dynamic D flip-flop with an inverted output. The clock buffer 200 is composed of two stages of inverters 201, 202 connected in series. The inverters 201, 202 generate CLKN and CLKP signals respectively for controlling the dynamic D flip-flop with an inverted output. The clock buffer 200 buffers an input clock signal CK and supplies the clock signals CLKN and CLKP, which are inverted with respect to each other, to the dynamic D flip-flop with an inverted output. Only two inverters are shown in FIG. 2. Certainly, more inverters may be provided, instead of being limited to two.

Figure 3:
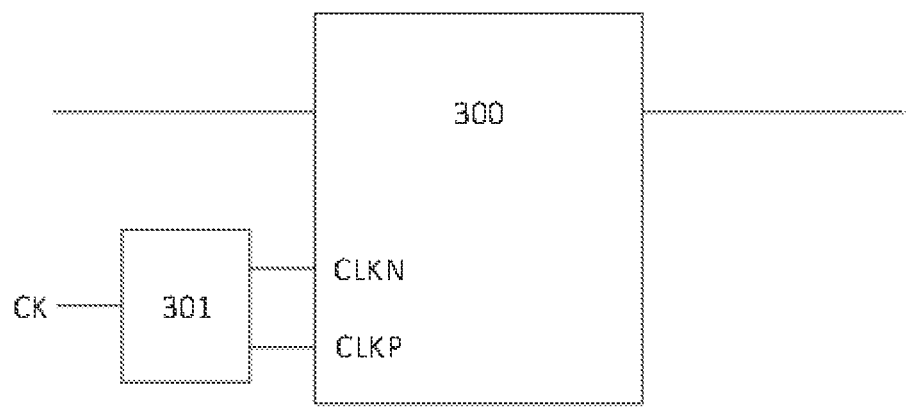
FIG. 3 shows a dynamic D flip-flop with an inverted output with clock control according to some embodiments of the present disclosure.

FIG. 3 shows a dynamic D flip-flop 300 with an inverted output with clock control. As shown in FIG. 3, after a clock signal CK is buffered by a clock buffer 301, clock signals CLKN, CLKP are supplied to the dynamic D flip-flop 300 with an inverted output.

Figure 4A:
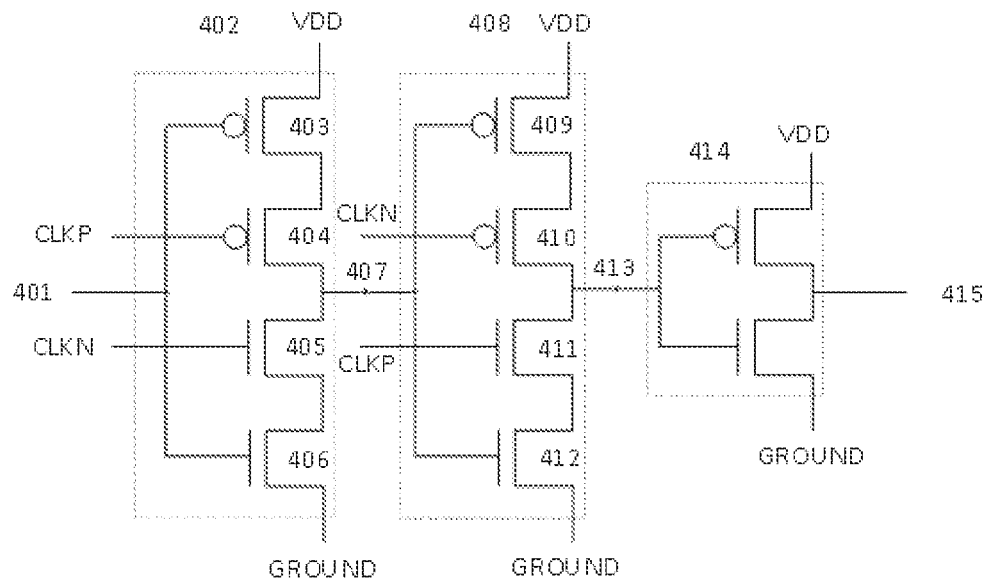
FIGS. 4A, 4B, 4C, and 4D show schematic circuit diagrams of dynamic D flip-flops with an inverted output according to some embodiments of the present disclosure, respectively.

FIG. 4A shows a schematic circuit diagram of a dynamic D flip-flop with an inverted output according to some embodiments of the present disclosure. The dynamic D flip-flop 400 with an inverted output receives input data from an input end 401 to a first latch 402, the first latch 402 being a tri-state inverter. The first latch 402 includes a plurality of switch elements connected to one another in series. In a specific embodiment, the first latch 402 includes a first positive channel metal oxide semiconductor (PMOS) transistor 403, a second PMOS transistor 404, a first negative channel metal oxide semiconductor (NMOS) transistor 405, and a second NMOS transistor 406, wherein the first PMOS transistor 403, the second PMOS transistor 404, the first NMOS transistor 405, and the second NMOS transistor 406 being sequentially connected in series between a power source (VDD) and a ground (GND).

As shown in FIG. 4A, a source of the first PMOS transistor 403 is connected to the power source (VDD), a source of the second PMOS transistor 404 is connected to a drain of the first PMOS transistor 403, a drain of the first NMOS transistor 405 is connected to a drain of the second PMOS transistor 404, a drain of the second NMOS transistor 406 is connected to a source of the first NMOS transistor 405, and a source of the second NMOS transistor 406 is connected to the ground GND. A gate of the first PMOS transistor 403 is connected to a gate of the second NMOS transistor 406, to receive the input data from the input end. A gate of the second PMOS transistor 404 is set to receive a clock signal CLKP, and a gate of the first NMOS transistor 405 is set to receive a clock signal CLKN.

When CLKN is at a low level, CLKP is at a high level, the second PMOS transistor 404 and the first NMOS transistor 405 are both in off states, the first latch 402 is in a high-impedance state, and the data of the input end 401 cannot pass through the first latch 402. Since the data at the input end 401 cannot pass through the first latch 402, data at a node 407 may be latched at the node 407 and maintain an original state for registering the data. When CLKN is at a high level, CLKP is at a low level, the second PMOS transistor 404 and the first NMOS transistor 405 are both in on states, the first latch 402 inverts the data at the input end 401, that is, inverts the data of the input end 401 and outputs an inverted data to the node 407, to overwrite the data at the node 407.

Similarly, a second latch 408 is also a tri-state inverter including a plurality of switch elements connected to one another in series. As shown in FIG. 4A, the second latch 408 includes a third PMOS transistor 409, a fourth PMOS transistor 410, a third NMOS transistor 411, and a fourth NMOS transistor 412 sequentially connected in series. A gate of the third PMOS transistor 409 is connected to a gate of the fourth NMOS transistor 412, to receive the data from the first latch 402. A gate of the fourth PMOS transistor 410 is set to receive a clock signal CLKN, and a gate of the third NMOS transistor 411 is set to receive a clock signal CLKP.

When CLKN is at a low level, CLKP is at a high level, the fourth PMOS transistor 410 and the third NMOS transistor 411 are both in on states, and the second latch 408 inverts the data at the input end 401, that is, carries out an inverted transmission on the data at the node 407 to a node 413, to overwrite data at the node 413. When CLKN is at a high level, CLKP is at a low level, the second latch 408 is in a high-impedance state, and the data at the node 407 cannot pass through the second latch 408. Therefore, data at the node 413 now is latched at the node 413 and maintain an original state for registering the data.

As shown in FIG. 4A, an output driving unit of the dynamic D flip-flop with an inverted output is an inverter 414. The inverter 414 inverts the data received from the second latch 408 again, to finally transmit the inverted data to an output end 415. Since the first latch, the second latch, and the inverter invert the data three times in total, the data of the output end 415 of the dynamic D flip-flop with an inverted output are inverted compared with those at the input end 401.

Compared with a traditional dynamic D flip-flop with an inverter as a first stage, the present disclosure omits an input inverter to change the output end to an inverted output. Therefore, the number of the transistors of the dynamic D flip-flop is reduced from 12 to 10, thereby reducing the chip area by 16% or so. In addition, as one stage of inverter is omitted, power will also be reduced correspondingly.

In addition, the dynamic D flip-flop with an inverted output of the present disclosure omits an input end inverter and retains an output end inverter. Such a design takes into account that: compared with omitting the output end inverter, retaining the output end inverter (that is, omitting the input end inverter) may retain a strong capacity of the dynamic D flip-flop for driving subsequent circuits, so that the dynamic D flip-flop may drive a large load later. Since the first stage of the dynamic D flip-flop with an inverted output of the present disclosure is a tri-state gate circuit with a small capacitance, a small driving difficulty is provided. Therefore, it is not necessary to specifically provide one stage of inverter for driving the tri-state gate circuit.

The advantageous technical effect is also suitable for the dynamic D flip-flops with an inverted output shown in FIGS. 4B-4D and FIGS. 6A-6D hereafter.

Figure 4B:
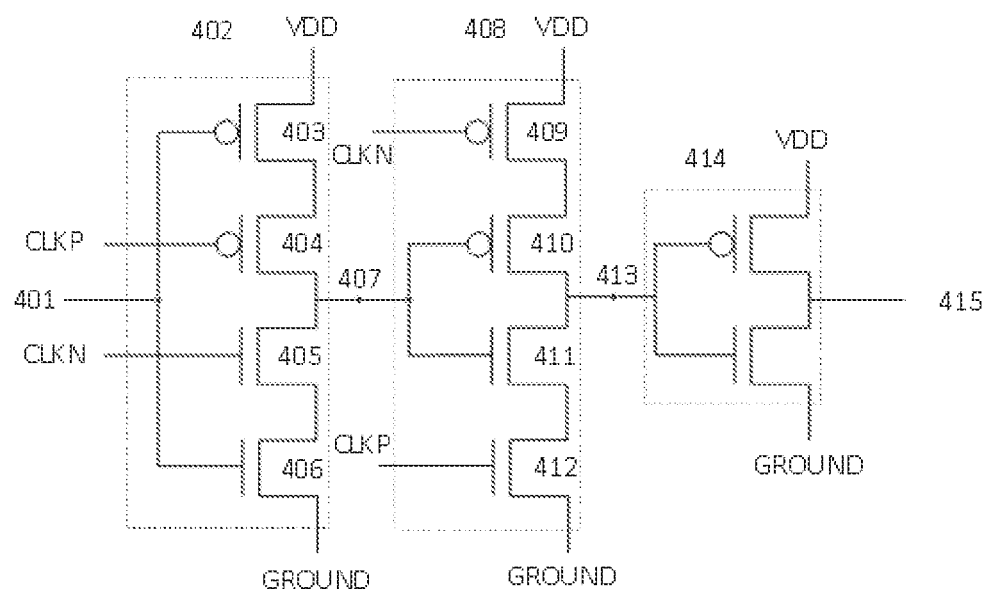

FIG. 4B shows a schematic circuit diagram of a dynamic D flip-flop with an inverted output according to some embodiments of the present disclosure. The dynamic D flip-flop 400 with an inverted output receives input data from an input end 401 to a first latch 402, the first latch 402 being a tri-state inverter. The first latch 402 includes a plurality of switch elements connected to one another in series. In a specific embodiment, the first latch 402 includes a first PMOS transistor 403, a second PMOS transistor 404, a first NMOS transistor 405, and a second NMOS transistor 406, wherein the first PMOS transistor 403, the second PMOS transistor 404, the first NMOS transistor 405, and the second NMOS transistor 406 being sequentially connected in series between a power source (VDD) and a ground (GND).

As shown in FIG. 4B, a source of the first PMOS transistor 403 is connected to the power source (VDD), a source of the second PMOS transistor 404 is connected to a drain of the first PMOS transistor 403, a drain of the first NMOS transistor 405 is connected to a drain of the second PMOS transistor 404, a drain of the second NMOS transistor 406 is connected to a source of the first NMOS transistor 405, and a source of the second NMOS transistor 406 is connected to the ground (GND). A gate of the first PMOS transistor 403 is connected to a gate of the second NMOS transistor 406, to receive the input data from the input end. A gate of the second PMOS transistor 404 is set to receive a clock signal CLKP, and a gate of the first NMOS transistor 405 is set to receive a clock signal CLKN.

When CLKN is at a low level, CLKP is at a high level, the second PMOS transistor 404 and the first NMOS transistor 405 are both in off states, the first latch 402 is in a high-impedance state, and the data of the input end 401 cannot pass through the first latch 402. Since the data at the input end 401 cannot pass through the first latch 402, data at a node 407 may be latched at the node 407 and maintain an original state for registering the data. When CLKN is at a high level, CLKP is at a low level, the second PMOS transistor 404 and the first NMOS transistor 405 are both in on states, the first latch 402 inverts the data of the input end, that is, inverts the data of the input end 401 and outputs an inverted data to the node 407, to overwrite the data at the node 407.

Similarly, a second latch 408 is also a tri-state inverter including a plurality of switch elements connected to one another in series. As shown in FIG. 4B, the second latch 408 includes a third PMOS transistor 409, a fourth PMOS transistor 410, a third NMOS transistor 411, and a fourth NMOS transistor 412 sequentially connected in series. A gate of the fourth PMOS transistor 410 is connected to a gate of the third NMOS transistor 411, to receive the data from the first latch 402. A gate of the third PMOS transistor 409 is set to receive a clock signal CLKN, and a gate of the fourth NMOS transistor 412 is set to receive a clock signal CLKP.

When CLKN is at a low level, CLKP is at a high level, the third PMOS transistor 409 and the fourth NMOS transistor 412 are both in on states, and the second latch 408 inverts the data of the input end, that is, carries out an inverted transmission on the data at the node 407 to a node 413, to overwrite data at the node 413. When CLKN is at a high level, CLKP is at a low level, the second latch 408 is in a high-impedance state, and the data at the node 407 cannot pass through the second latch 408. Therefore, data at the node 413 is now latched at the node 413 and maintain an original state for registering the data.

As shown in FIG. 4B, an output driving unit of the dynamic D flip-flop with an inverted output is an inverter 414. The inverter 414 inverts the data received from the second latch 408 again, to finally transmit inverted data to an output end 415. Since the first latch, the second latch, and the inverter invert the data three times in total, the data of the output end 415 of the dynamic D flip-flop with an inverted output are inverted compared with those at the input end.

Figure 4C:
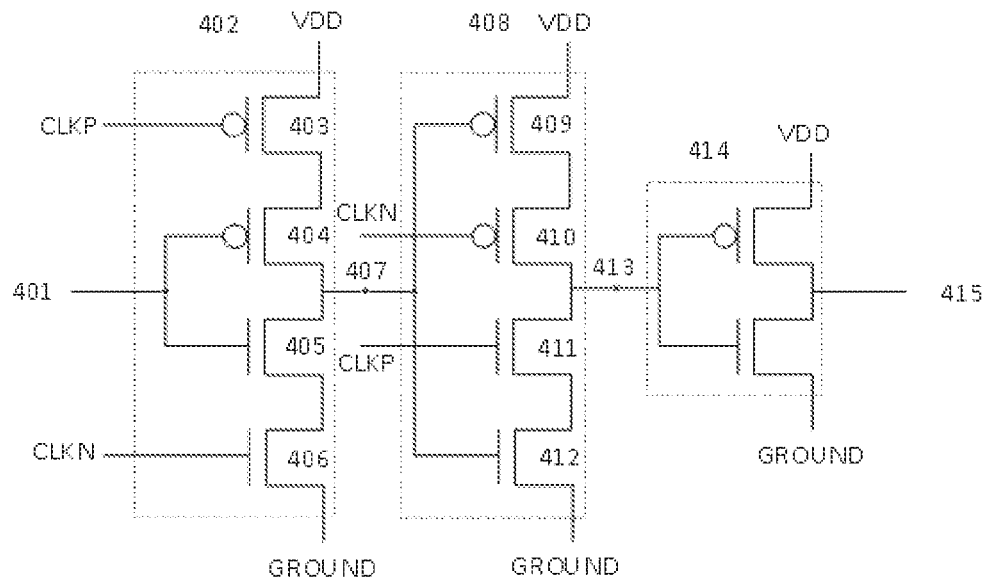

FIG. 4C shows a schematic circuit diagram of a dynamic D flip-flop with an inverted output according to some embodiments of the present disclosure. The dynamic D flip-flop 400 with an inverted output receives input data from an input end 401 to a first latch 402, the first latch 402 being a tri-state inverter. The first latch 402 includes a plurality of switch elements connected to one another in series. In a specific embodiment, the first latch 402 includes a first PMOS transistor 403, a second PMOS transistor 404, a first NMOS transistor 405, and a second NMOS transistor 406, wherein the first PMOS transistor 403, the second PMOS transistor 404, the first NMOS transistor 405, and the second NMOS transistor 406 being sequentially connected in series between a power source (VDD) and a ground (GND).

As shown in FIG. 4C, a source of the first PMOS transistor 403 is connected to the power source (VDD), a source of the second PMOS transistor 404 is connected to a drain of the first PMOS transistor 403, a drain of the first NMOS transistor 405 is connected to a drain of the second PMOS transistor 404, a drain of the second NMOS transistor 406 is connected to a source of the first NMOS transistor 405, and a source of the second NMOS transistor 406 is connected to the ground (GND). A gate of the second PMOS transistor 404 is connected to a gate of the first NMOS transistor 405, to receive the input data from the input end. A gate of the first PMOS transistor 403 is set to receive a clock signal CLKP, and a gate of the second NMOS transistor 406 is set to receive a clock signal CLKN.

When CLKN is at a low level, CLKP is at a high level, the first PMOS transistor 403 and the second NMOS transistor 406 are both in off states, the first latch 402 is in a high-impedance state, and the data of the input end 401 cannot pass through the first latch 402. Since the data at the input end 401 cannot pass through the first latch 402, data at a node 407 may be latched at the node 407 and maintain an original state for registering the data. When CLKN is at a high level, CLKP is at a low level, the first PMOS transistor 403 and the second NMOS transistor 406 are both in on states, the first latch 402 inverts the data of the input end, that is, inverts the data of the input end 401 and outputs inverted data to the node 407, to overwrite the data at the node 407.

Similarly, a second latch 408 is also a tri-state inverter including a plurality of switch elements connected to one another in series. As shown in FIG. 4C, the second latch 408 includes a third PMOS transistor 409, a fourth PMOS transistor 410, a third NMOS transistor 411, and a fourth NMOS transistor 412 sequentially connected in series. A gate of the third PMOS transistor 409 is connected to a gate of the fourth NMOS transistor 412, to receive the data from the first latch 402. A gate of the fourth PMOS transistor 410 is set to receive a clock signal CLKN, and a gate of the third NMOS transistor 411 is set to receive a clock signal CLKP.

When CLKN is at a low level, CLKP is at a high level, the fourth PMOS transistor 410 and the third NMOS transistor 411 are both in on states, and the second latch 408 inverts data of the input end, that is, carries out an inverted transmission on the data at the node 407 to a node 413, to overwrite data at the node 413. When CLKN is at a high level, CLKP is at a low level, the second latch 408 is in a high-impedance state, and the data at the node 407 cannot pass through the second latch 408. Therefore, data at the node 413 is now latched at the node 413 and maintain an original state for registering the data.

As shown in FIG. 4C, an output driving unit of the dynamic D flip-flop with an inverted output is an inverter 414. The inverter 414 inverts the data received from the second latch 408 again, to finally transmit inverted data to an output end 415. Since the first latch, the second latch, and the inverter invert the data three times in total, the data of the output end 415 of the dynamic D flip-flop with an inverted output are inverted compared with those at the input end.

Figure 4D:
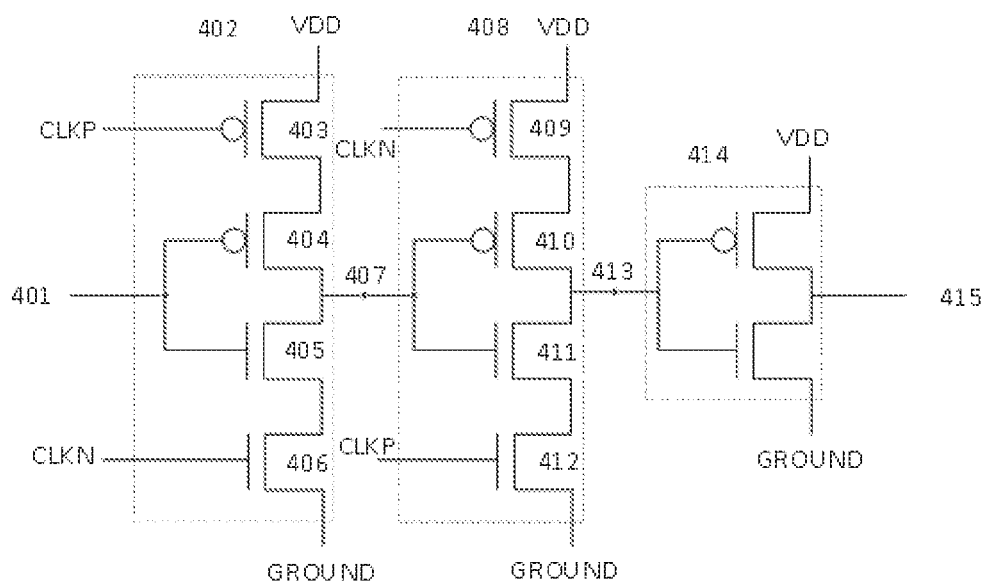

FIG. 4D shows a schematic circuit diagram of a dynamic D flip-flop with an inverted output according to some embodiments of the present disclosure. The dynamic D flip-flop 400 with an inverted output receives input data from an input end 401 to a first latch 402, the first latch 402 being a tri-state inverter. The first latch 402 includes a plurality of switch elements connected to one another in series. In a specific embodiment, the first latch 402 includes a first PMOS transistor 403, a second PMOS transistor 404, a first NMOS transistor 405, and a second NMOS transistor 406, wherein the first PMOS transistor 403, the second PMOS transistor 404, the first NMOS transistor 405, and the second NMOS transistor 406 being sequentially connected in series between a power source (VDD) and a ground (GND).

As shown in FIG. 4D, a source of the first PMOS transistor 403 is connected to the power source (VDD), a source of the second PMOS transistor 404 is connected to a drain of the first PMOS transistor 403, a drain of the first NMOS transistor 405 is connected to a drain of the second PMOS transistor 404, a drain of the second NMOS transistor 406 is connected to a source of the first NMOS transistor 405, and a source of the second NMOS transistor 406 is connected to the ground (GND). A gate of the second PMOS transistor 404 is connected to a gate of the first NMOS transistor 405, to receive the input data from the input end. A gate of the first PMOS transistor 403 is set to receive a clock signal CLKP, and a gate of the second NMOS transistor 406 is set to receive a clock signal CLKN.

When CLKN is at a low level, CLKP is at a high level, the first PMOS transistor 403 and the second NMOS transistor 406 are both in off states, the first latch 402 is in a high-impedance state, and the data of the input end 401 cannot pass through the first latch 402. Since the data at the input end 401 cannot pass through the first latch 402, data at a node 407 may be latched at the node 407 and maintain an original state for registering the data. When CLKN is at a high level, CLKP is at a low level, the first PMOS transistor 403 and the second NMOS transistor 406 are both in on states, the first latch 402 inverts the data of the input end, that is, inverts the data of the input end 401 and outputs inverted data to the node 407, to overwrite the data at the node 407.

Similarly, a second latch 408 is also a tri-state inverter including a plurality of switch elements connected to one another in series. As shown in FIG. 4D, the second latch 408 includes a third PMOS transistor 409, a fourth PMOS transistor 410, a third NMOS transistor 411, and a fourth NMOS transistor 412 sequentially connected in series. A gate of the fourth PMOS transistor 410 is connected to a gate of the third NMOS transistor 411, to receive the data from the first latch 402. A gate of the third PMOS transistor 409 is set to receive a clock signal CLKN, and a gate of the fourth NMOS transistor 412 is set to receive a clock signal CLKP.

When CLKN is at a low level, CLKP is at a high level, the third PMOS transistor 409 and the fourth NMOS transistor 412 are both in on states, and the second latch 408 inverts the data of the input end, that is, carries out an inverted transmission on the data at the node 407 to a node 413, to overwrite data at the node 413. When CLKN is at a high level, CLKP is at a low level, the second latch 408 is in a high-impedance state, and the data at the node 407 cannot pass through the second latch 408. Therefore, data at the node 413 now is latched at the node 413 and maintain an original state for registering the data.

As shown in FIG. 4D, an output driving unit of the dynamic D flip-flop with an inverted output is an inverter 414. The inverter 414 inverts the data received from the second latch 408 again, to finally transmit an inverted data to an output end 415. Since the first latch, the second latch, and the inverter invert the data three times in total, the data of the output end 415 of the dynamic D flip-flop with an inverted output are inverted compared with those at the input end.

The dynamic D flip-flops with an inverted output shown in FIGS. 4A-4D are all variations of the present disclosure and differ from one another in positions of the transistors under the clock control in the first latches 402 and the second latches 408.

Figure 5:
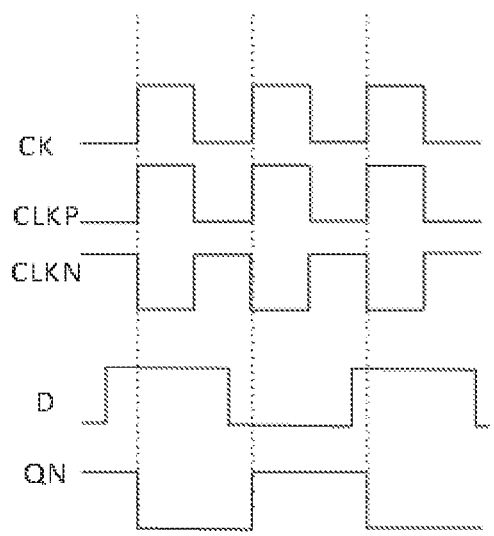
FIG. 5 shows a circuit timing diagram of the dynamic D flip-flops with an inverted output shown in FIGS. 4A, 4B, 4C, and 4D.
Figure 6A:
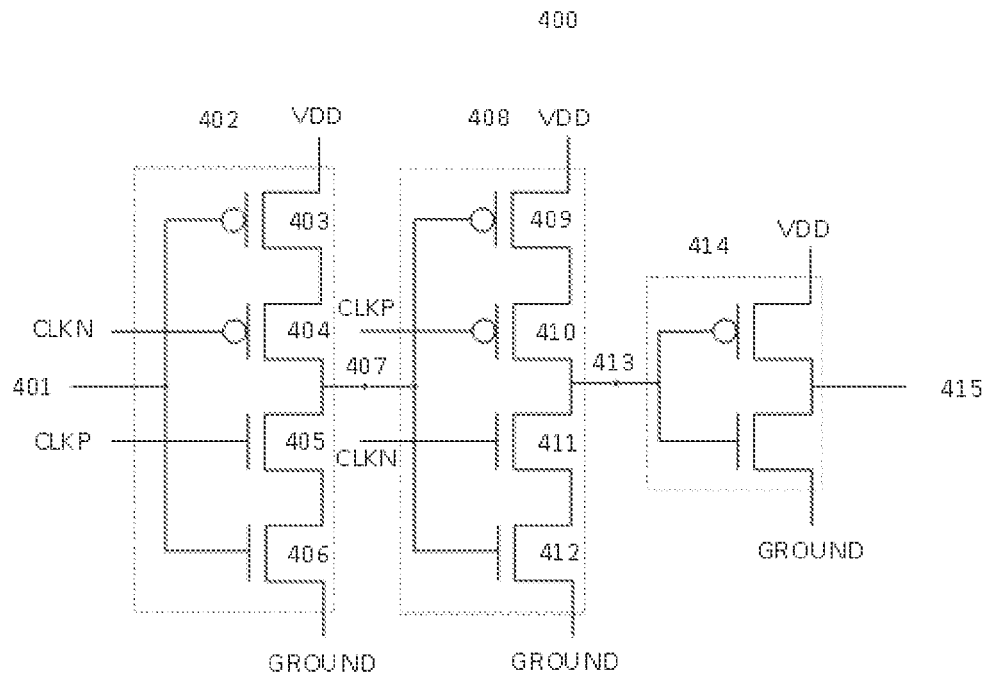
FIGS. 6A, 6B, 6C, and 6D show schematic circuit diagrams of dynamic D flip-flops with an inverted output according to some other embodiments of the present disclosure.
Figure 6B:
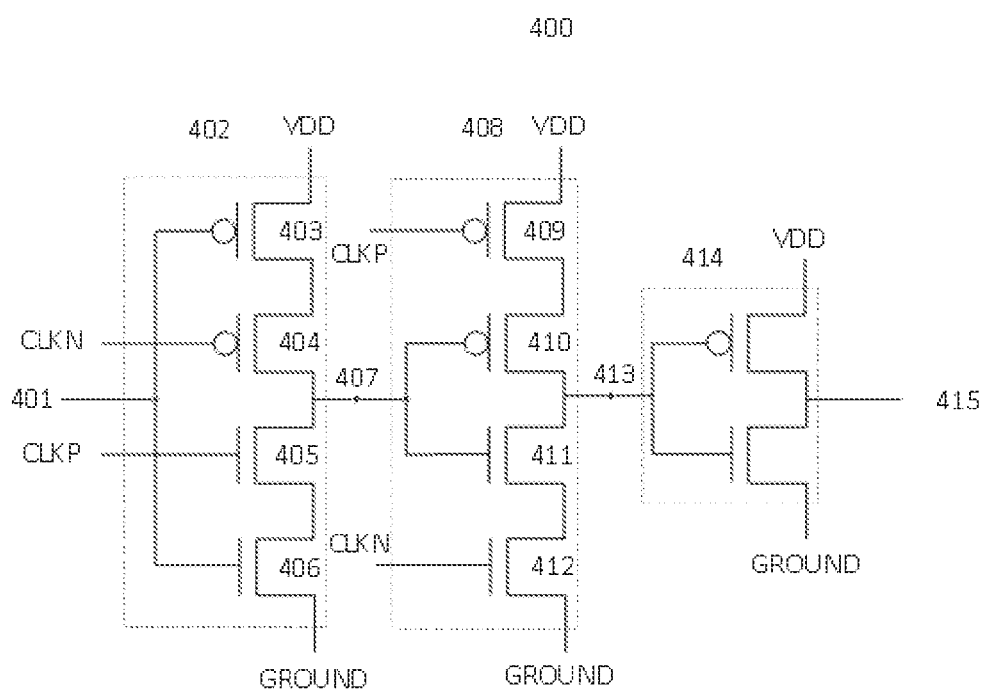
Figure 6C:
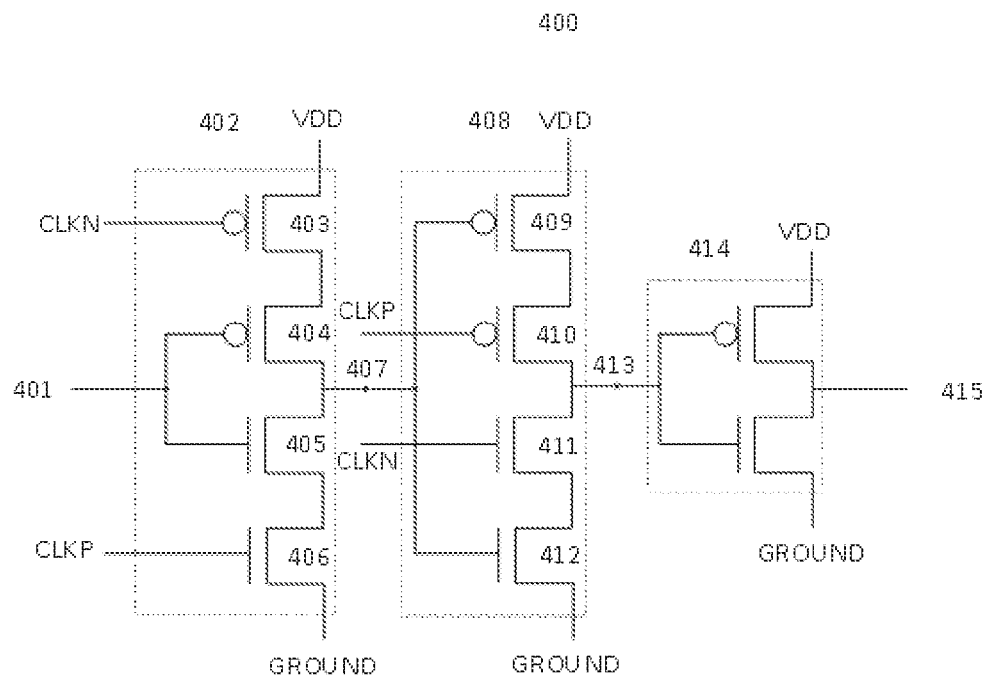
Figure 6D:
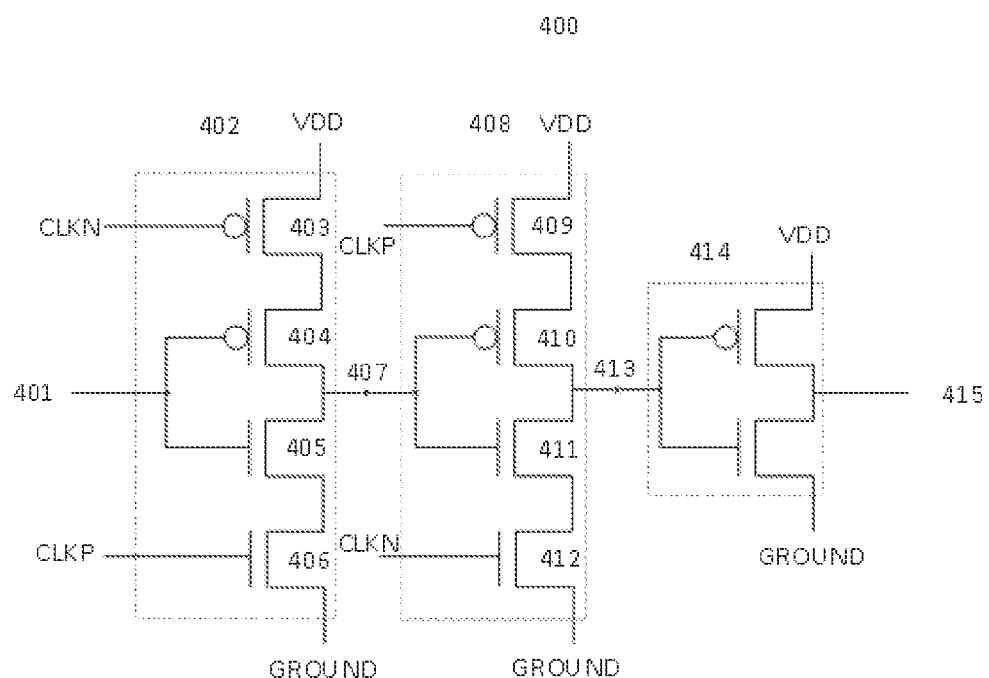

Working principles according to the dynamic D flip-flop with an inverted output are described in detail below in conjunction with FIG. 5 (FIG. 5 shows a circuit timing diagram of the dynamic D flip-flops with an inverted output shown in FIGS. 4A, 4B, 4C, and 4D).

As shown in FIGS. 4A, 4B, 4C, and 4D, when CK is at a low level, CLKP is at the low level and CLKN is at the high level. Transistors under the control of the clock signals CLKN and CLKP in the first latch 402 are in on states, the first latch 402 inverts the data of the input end, that is, inverts the data of the input end 401 and outputs an inverted data to the node 407, to overwrite the data at the node 407. For example, when the input data D is 0, the data at the node 407 will be 1. When CLKP is at the low level and CLKN is at the high level, transistors under the control of the clock signals CLKN and CLKP in the second latch 408 are in off states, the second latch 408 is in the high-impedance state, and the data at the node 407 cannot pass through the second latch 408. The data at the node 413 may be latched in the node 413 and maintain the original state for registering the data, and an output of the dynamic D flip-flop maintains an original state.

Next, as shown in FIG. 5, when a rising edge of CK comes, CLKP leaps to the high level and CLKN leaps to the low level. The transistors under the control of the clock signals CLKN and CLKP in the first latch 402 are in off states, the first latch 402 is in the high-impedance state, and the data at the input end cannot pass through the first latch 402, so that the data at 407 are maintained. In this case, the transistors under the control of the clock signals CLKN and CLKP in the second latch 408 are in on states, the second latch 408 is turned on to invert the data of the input end, so that the data maintained at the node 407 are subjected to be inverted output to the node 413, and then output to the output end 415 through the inverter 414. It may be seen that an output state of the dynamic D flip-flop is changed when the rising edge of the clock signal CK comes. Since the input data are inverted three times in total, the output end outputs inverted data of the input end. Therefore, as shown in FIG. 5, in the case that the rising edge of CK comes, when the input end D is 1, the output end QN leaps to 0, and when the input end D is 0, the output end QN leaps to 1.

Figure 7:
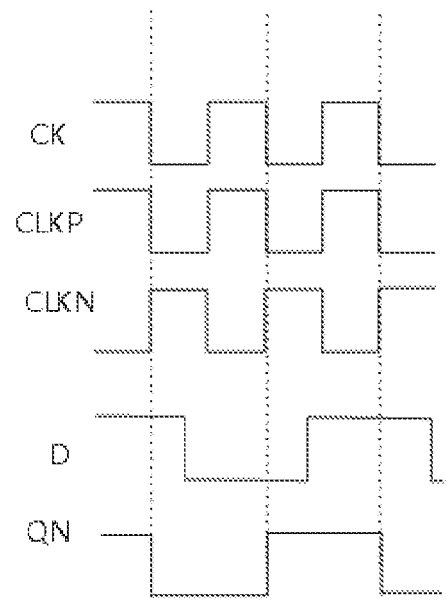
FIG. 7 shows a circuit timing diagram of the dynamic D flip-flops with an inverted output shown in FIGS. 6A, 6B, 6C, and 6D.

Alternatively, positions of clock control signals of the dynamic D flip-flop may be interchanged (for example, the NMOS transistors of the first latch 402 is controlled through CLKP, the PMOS transistors of the first latch 402 is controlled through CLKN; the PMOS transistors of the second latch 408 is controlled through CLKP, the NMOS transistors of the second latch 408 is controlled through CLKN), to implement the dynamic D flip-flop which is active on the falling edges. FIGS. 6A, 6B, 6C, and 6D show four different variations after the positions of the clock control signals CLKP and CLKN are interchanged, respectively. FIG. 7 shows a timing diagram for the circuits shown in FIGS. 6A, 6B, 6C, and 6D.

As shown in FIGS. 6A, 6B, 6C, and 6D, when CK is at a high level, CLKP is at a high level and CLKN is at a low level. Transistors under the control of clock signals CLKN and CLKP in a first latch 402 are in on states, the first latch 402 inverts the data of an input end, that is, inverts the data of the input end 401 and outputs inverted data to a node 407, to overwrite data at the node 407. For example, when the input data D is 0, the data at the node 407 will be 1. When CLKP is at the high level and CKLN is at the low level, transistors under the control of the clock signals CLKN and CLKP in a second latch 408 are in off states, the second latch 408 is in a high-impedance state, and the data at the node 407 cannot pass through the second latch 408. Data at a node 413 may be latched at the node 413 and maintain an original state for registering the data, and an output of the dynamic D flip-flop maintains an original state.

When a falling edge comes, CLKP leaps to a low level and CLKN leaps to a high level. The transistors under the control of the clock signals CLKN and CLKP in the first latch 402 are in off states, the first latch 402 is in a high-impedance state, and the data at the input end cannot pass through the first latch 402, so that the data at 407 are maintained. In this case, the transistors under the control of the clock signals CLKN and CLKP in the second latch 408 are in on states, the second latch 408 is turned on to invert the data of the input end, so that the data maintained at the node 407 are subjected to be inverted output to the node 413, and then output to the output end 415 through the inverter 414. It may be seen that an output state of the dynamic D flip-flop is changed when the falling edge of the clock signal CK comes. Since the input data are inverted three times in total, the output end outputs inverted data of the input end. Therefore, as shown in FIG. 7, in the case that the falling edge of CK comes, when the input end D is 0, the output end QN leaps to 1, and when the input end D is 1, the output end QN leaps to 0.

Figure 8:
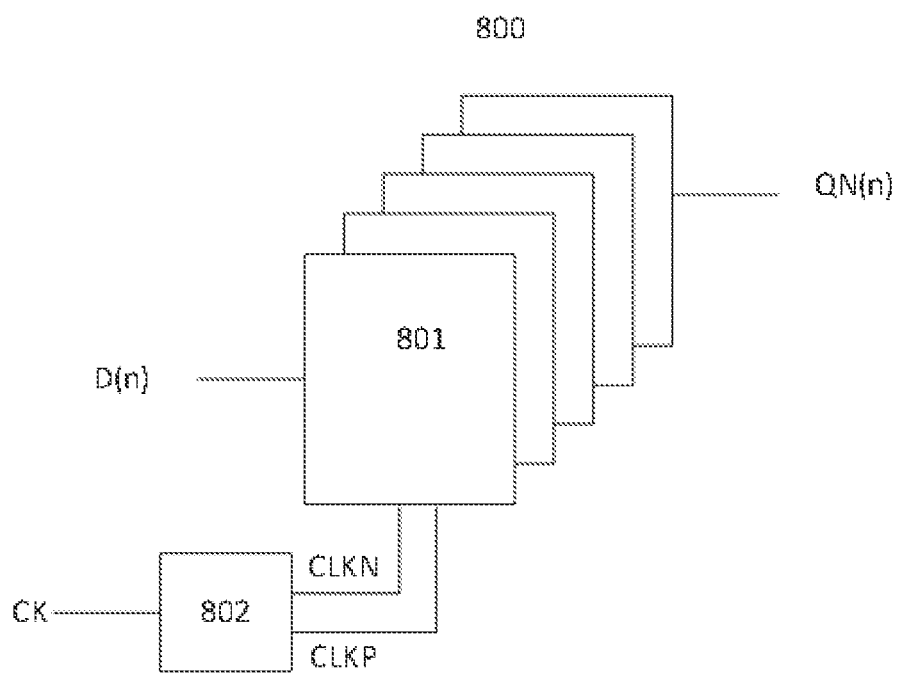
FIG. 8 shows a multi-channel parallel register consisting of a multi-channel parallel dynamic D flip-flop with an inverted output.

FIG. 8 shows a multi-channel parallel register applying the dynamic D flip-flop with an inverted output in the embodiments of the present disclosure. As shown in FIG. 8, the multi-channel parallel register 800 includes multi-channel parallel dynamic D flip-flops 801 with an inverted output, a clock buffer 802, a clock signal end CK, a multi-channel input end D (n), and a multi-channel output end QN (n), n donating n channels of input/output. The multi-channel input end D (n) is used for inputting data; the multi-channel output end QN (n) is used for outputting data; the clock signal end CK is used for receiving clock signals; and the clock buffer 802 is used for buffering the clock signals received by the clock signal end CK and then supplying the clock signals to a plurality of dynamic D flip-flops 801 with an inverted output, the plurality of dynamic D flip-flops 801 with an inverted output being connected in parallel between the multi-channel input end D (n) and the multi-channel output end QN (n), and used for latching and/or reading data, under the control of a clock signal CK, and each of the dynamic D flip-flops 801 with an inverted output being the dynamic D flip-flop with an inverted output according to the embodiments of the present disclosure in combination with FIGS. 1-7.

Generally, a separate D flip-flop requires one clock buffer to generate mutually-inverted clock signals to control a clock input end of the D flip-flop. If a separate clock buffer is configured for each of the D flip-flops, the clock buffers will occupy a considerable chip area and consume considerable power in applications required to use the plurality of D flip-flops. To solve the problem, one clock buffer in the present disclosure drives the plurality of dynamic D flip-flops at the same time, thereby effectively reducing the area and reducing the power consumption. In addition, compared with the traditional dynamic D flip-flop, the present disclosure omits the first-stage input inverter of the dynamic D flip-flop, so that the number of transistors of each of the dynamic D flip-flops is reduced, thereby reducing the overall chip area and overall power. Under the comprehensive action of the above improvements, the register claimed by the present disclosure further has the advantages of reducing the area and the power compared with a traditional register.

The present disclosure further provides a device for a Bitcoin mining algorithm. The device includes the dynamic D flip-flop 400 with an inverted output as described above or the multi-channel parallel register 800 applying a dynamic D flip-flop with an inverted output as described above.

In all examples shown and discussed herein, any specific value should be merely interpreted as exemplary, instead of serving as a limitation. Therefore, other examples of exemplary embodiments may have different values.

The words "front", "back", "top", "bottom", "above", "below", etc. in this specification and in the claims, if any, are used for descriptive purposes and not necessarily for describing constant relative positions. It should be understood that the words so used are interchangeable under appropriate circumstances, so that the embodiments of the present disclosure described herein, for example, may be operated in other orientations than those shown or otherwise described herein.

As used herein, the word "exemplary" is intended to mean "serving as an example, instance, or illustration", rather than as a "model" to be accurately reproduced. Any implementation exemplarily described herein is not necessarily to be interpreted as preferred or advantageous over other implementations. Moreover, the present disclosure is not defined by any expressed or implied theory presented in the technical field, the background art, the summary of the present disclosure or the detailed description of the embodiments described above.

As used herein, the word "substantially" is intended to encompass any slight variation due to imperfections in design or manufacture, tolerances of devices or elements, environmental influences, and/or the like. The word "substantially" also allows differences from a perfect or ideal circumstance due to parasitic effects, noise, and other practical considerations that may be present in an actual implementation.

The above description may indicate elements, nodes or features being "connected" or "coupled" together. As used herein, unless expressly stated otherwise, "connected" is intended to mean that one element/node/feature is directly connected to (or directly communicates with) another element/node/feature electrically, mechanically, logically or the like. Similarly, unless expressly stated otherwise, "coupled" is intended to mean that one element/node/feature may be connected to another element/node/feature mechanically, electrically, logically or the like in a direct or indirect manner, to allow interaction, even though these two features may not be directly connected. That is to say, "coupled" is intended to encompass direct connection and indirect connection of elements or other features, including connection through one or more intermediate elements.

It should also be understood that the word "comprising/encompassing", when used herein, means the presence of referred features, entireties, steps, operations, units, and/or assemblies, but cannot preclude the presence or addition of one or more other features, entireties, steps, operations, units, assemblies, and/or a combination thereof.

Those skilled in the art should realize that boundaries between the operations described above are merely illustrative. A plurality of operations may be combined into a single operation, a single operation may be distributed in additional operations, and the operations may be executed at least partially overlapping in time. Moreover, alternative embodiments may include a plurality of instances of a specific operation, and an operation order may be changed in other various embodiments. However, other modifications, variations, and alternatives may also be made. Therefore, the present description and the drawings should be deemed illustrative, rather than restrictive.

Although some specific embodiments of the present disclosure have been described in detail through the examples, it should be understood by those skilled in the art that the examples described above are merely illustrative, instead of being intended to limit the scope of the present disclosure. All the embodiments disclosed herein may be combined at random, without departing from the spirit and scope of the present disclosure. Those skilled in the art should also understand that various modifications may be made to the embodiments without departing from the scope and spirit of the present disclosure. The scope of the present disclosure is defined by the appended claims.

What is claimed is:

1. A dynamic D flip-flop with an inverted output, comprising:
   an input end configured for receiving input data from external to the dynamic D flip-flop;
   an output end configured for providing output data in response to the input data;
   a clock signal end configured for receiving clock signals;

a first latch configured for latching the input data from the input end and carrying out, under the control of the clock signals, an inverted transmission on the input data;
a second latch configured for latching the data from the first latch and carrying out, under the control of the clock signals, an inverted transmission on the data latched by the first latch; and
an inverter configured for carrying out an inverted output on the data received from the second latch,
wherein the first latch, the second latch, and the inverter are sequentially connected in series between the input end and the output end, the dynamic D flip-flop with an inverted output does not have an inverter between the input end and the first latch, and the first latch is a tri-state inverter whose input end directly provides the input end of the dynamic D flip-flop with an inverted output,
wherein the dynamic D flip flop comprises a first node at an input end of the second latch and a second node at an output end of the second latch, and the clock signals comprise a first clock signal and a second clock signal, the first clock signal being inverted with respect to the second clock signal,
wherein the second latch is configured for:
in a case where one of the first and second clock signals is at a low level and another one of the first and second clock signals is at a high level, inverting the data at the first node and outputting the inverted data to the second node such that the data at the second node is overwritten; and
in a case where the one of the first and second clock signals is at a high level and the other one of the first and second clock signals is at a low level, preventing the data at the first node from passing therethrough such that the data at the second node is latched at the second node and maintains an original state.

2. The dynamic D flip-flop with an inverted output according to claim 1, wherein the second latch is a tri-state inverter.

3. The dynamic D flip-flop with an inverted output according to claim 2, wherein the tri-state inverter further comprises a first positive channel metal oxide semiconductor PMOS transistor, a second PMOS transistor, a first negative channel metal oxide semiconductor NMOS transistor, and a second NMOS transistor, the first PMOS transistor, the second PMOS transistor, the first NMOS transistor, and the second NMOS transistor being sequentially connected in series between a power source and a ground.

4. The dynamic D flip-flop with an inverted output according to claim 3, further comprising a clock buffer configured for supplying the clock signals to the clock signal end.

5. The dynamic D flip-flop with an inverted output according to claim 4, wherein the second PMOS transistor of the first latch and the first NMOS transistor of the second latch are subjected to, according to the first clock signal, on-off control; and the first NMOS transistor of the first latch and the second PMOS transistor of the second latch are subjected to, according to the second clock signal, on-off control.

6. The dynamic D flip-flop with an inverted output according to claim 4, wherein the second PMOS transistor of the first latch and the second NMOS transistor of the second latch are subjected to, according to the first clock signal, on-off control; and the first NMOS transistor of the first latch and the first PMOS transistor of the second latch are subjected to, according to the second clock signal, on-off control.

7. The dynamic D flip-flop with an inverted output according to claim 4, wherein the first PMOS transistor of the first latch and the first NMOS transistor of the second latch are subjected to, according to the first clock signal, on-off control; and the second NMOS transistor of the first latch and the second PMOS transistor of the second latch are subjected to, according to the second clock signal, on-off control.

8. The dynamic D flip-flop with an inverted output according to claim 4, wherein the first PMOS transistor of the first latch and the second NMOS transistor of the second latch are subjected to, according to the first clock signal, on-off control; and the second NMOS transistor of the first latch and the first PMOS transistor of the second latch are subjected to, according to the second clock signal, on-off control.

9. A multi-channel parallel register, comprising:
a plurality of input ends configured for inputting data;
a plurality of output ends configured for outputting data;
a clock signal end configured for receiving clock signals;
a clock buffer configured for buffering the clock signals received by the clock signal end and then supplying the clock signals to a plurality of dynamic D flip-flops, the plurality of dynamic D flip-flops being connected in parallel between the plurality of input ends and the plurality of output ends and configured for at least one of latching and reading data, under the control of the clock signals, wherein the dynamic D flip-flops are the dynamic D flip-flop with an inverted output according to claim 1.

10. A device for executing a Bitcoin mining algorithm, comprising the multi-channel parallel register according to claim 9.

11. A device for executing a Bitcoin mining algorithm, comprising the dynamic D flip-flop with an inverted output according to claim 1.

* * * * *